(12) United States Patent
Aoyama

(10) Patent No.: US 6,188,566 B1
(45) Date of Patent: Feb. 13, 2001

(54) SOLID ELECTROLYTIC CAPACITOR HAVING A SECOND LEAD WITH A THROUGHHOLE FILLED WITH AN ARC-EXTINGUISHING MATERIAL

(75) Inventor: Makoto Aoyama, Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/374,749

(22) Filed: Aug. 13, 1999

(30) Foreign Application Priority Data

Aug. 14, 1998 (JP) .................................................. 10-229751

(51) Int. Cl.⁷ ................................. H01G 2/12; H01G 9/00
(52) U.S. Cl. .......................... 361/534; 361/537; 361/540; 361/275.4
(58) Field of Search .................................. 361/273, 275.4, 361/275.1–275.2, 523, 528, 529, 533, 534, 535, 539–540, 538

(56) References Cited

U.S. PATENT DOCUMENTS

| | | | |
|---|---|---|---|
| 5,329,421 | * 7/1994 | Kuriyama | 361/534 |
| 5,402,307 | * 3/1995 | Kuriyama | 361/534 |
| 5,502,614 | * 3/1996 | Kuriyama | 361/534 |
| 5,583,740 | * 12/1996 | Fujino | 361/534 |
| 5,608,602 | * 3/1997 | Kuriyama | 361/534 |

* cited by examiner

Primary Examiner—Anthony Dinkins
(74) Attorney, Agent, or Firm—Coudert Brothers

(57) ABSTRACT

A compact solid electrolytic capacitor includes a capacitor element having a positive electrode and a negative electrode which are respectively connected electrically to a first lead and a second lead and a casing of a resin material surrounding the capacitor element. A low melting-point metal layer serving as a fuse, which will quickly melt under an abnormal condition, is inserted between and electrically connects the capacitor element and the second lead and an arc-extinguishing material capable of absorbing the melted metal of the low melting-point metallic material fills a throughhole through the second lead where the latter contacts the low melting-point metal layer. The low melting-point metal layer may be in the form of a flat ribbon of thickness only about 50–100 μm.

9 Claims, 2 Drawing Sheets

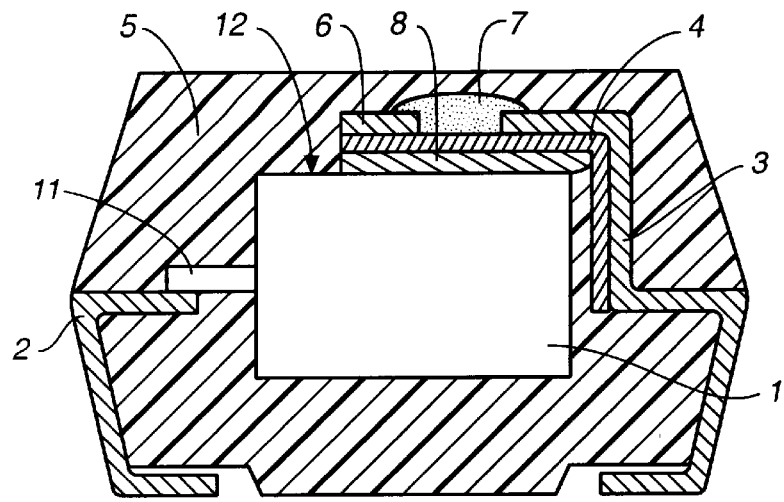
FIG._1
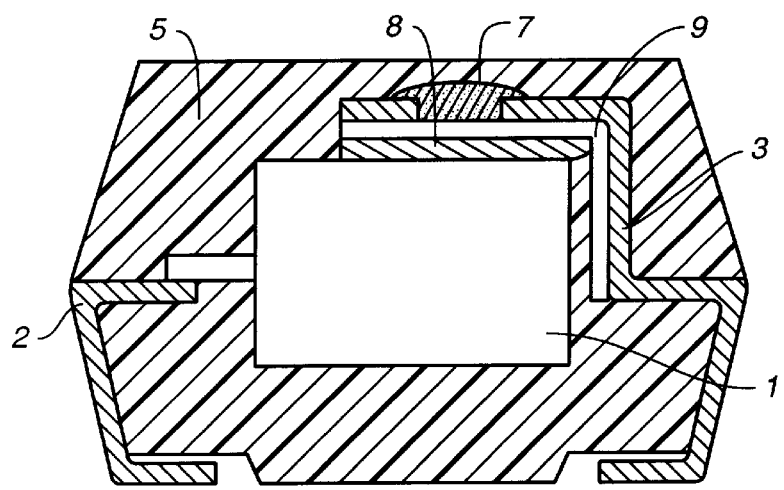
FIG._2
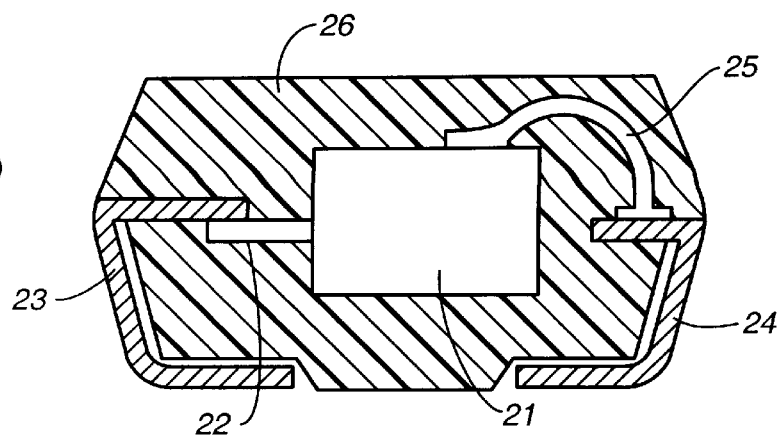
FIG._4
(PRIOR ART)

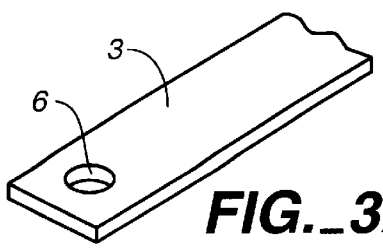
FIG._3A
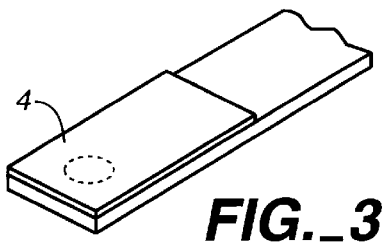
FIG._3B
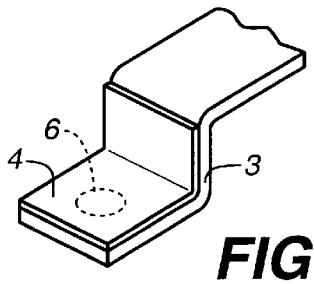
FIG._3C
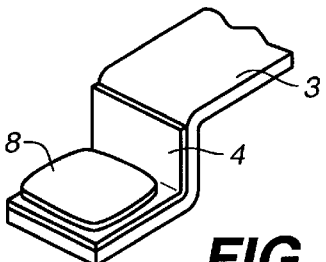
FIG._3D
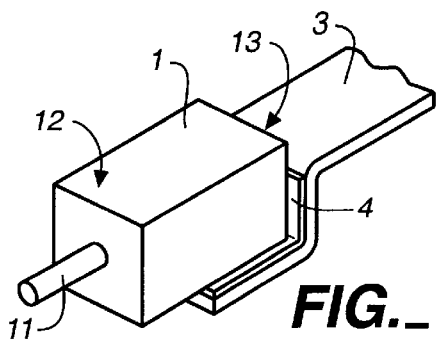
FIG._3E
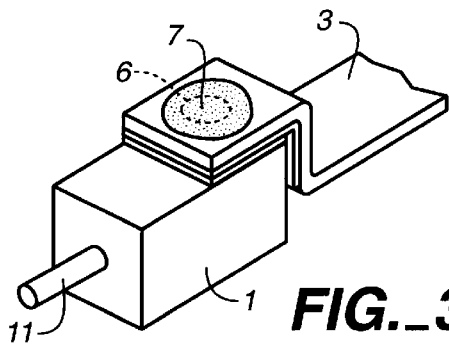
FIG._3F
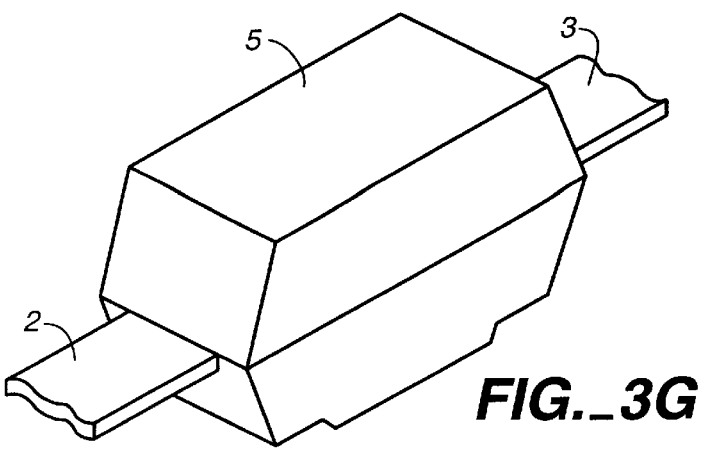
FIG._3G

SOLID ELECTROLYTIC CAPACITOR HAVING A SECOND LEAD WITH A THROUGHHOLE FILLED WITH AN ARC-EXTINGUISHING MATERIAL

BACKGROUND OF THE INVENTION

This invention relates to a solid electrolytic capacitor of the type containing within itself a circuit-opening mechanism such as a fuse. More particularly, the invention relates to such a solid electrolytic capacitor which can be designed to make its casing smaller or its capacitor element larger for the same size of its casing.

FIG. 4 shows an example of prior art solid electrolytic capacitor with a capacitor element 21 formed by subjecting a sintered body of valve action metallic powder such as tantalum powder to various treatment processes including chemical conversion process. A lead 22 is inserted into one of side surfaces of this capacitor element 21 to serve as its positive electrode, while its outer surface serves as its negative electrode. A first lead line 23 and a second lead line 24 are respectively connected electrically to the positive electrode 22 and the negative electrode. These electrodes are encapsulated inside a casing 26 of a resin material. The solid electrolytic capacitor thus structured has a definite polarity such that it will be short-circuited if it is connected in a wrong direction. In such a situation, not only may the capacitor heat up or become ignited but other electronic components of the circuit in which this solid electrolytic capacitor is incorporated may also be damaged. In view of such possibilities, a circuit-opening mechanism such as a fuse is frequently provided on the side of either the positive electrode or the negative electrode such that the circuit will open between the lead lines 23 and 24 in an abnormal situation. In order to make its connection easier, it has been known to provide a fuse 25 in the shape of a wire or a ribbon on the side of the negative electrode, as shown in FIG. 4. connecting between the negative electrode on the outer surface of the capacitor element 21 and the second lead line 24, being attached to them, say, be compression.

With the recent trend to miniaturize electronic components, it is becoming necessary to provide miniaturized tantalum capacitors. It is not desirable, however, to reduce the size of the casing 26 merely by making the capacitor element 21 smaller because this would adversely affect the electrical characteristic of the capacitor such as its capacitance. Instead, what is desirable is to reduce the size of the casing 26 while maintaining the electrical characteristic of the capacitor high by not making the capacitor element 21 smaller, or keeping the capacitor element 21 as large as possible.

For connecting the fuse 25 between the outer wall of the capacitor element 21 and the second lead line 24, however, the fuse 25 is usually formed in a smoothly arcuate shape, as shown in FIG. 4, because a fuse having a sharply bent portion would more easily come off the capacitor element 21 or the second lead line 24 to which it is attached by compression. If the fuse 25 is to have a slowly curving shape between the outer surface of the capacitor element 21 and the second lead line 24, however, the distance between the capacitor element 21 and the second lead line 24 as well as the distance between the capacitor element 21 and the upper surface of the casing 26 must be made sufficiently large, and this results in many wasteful spaces. Thus, there was a limit to how large the capacitor element could be made in order to improve the electrical characteristics of the capacitor while the size of the casing was kept fixed, or how small the capacitor could be made for a capacitor element of the same size with the same electrical characteristic. In other words, prior art solid electrolytic capacitors as shown in FIG. 4 could not satisfy the current demand for miniaturized high-quality electronic components.

SUMMARY OF THE INVENTION

It is therefore an object of this invention to provide a solid electrolytic capacitor with an improved design such that the size of its casing can be reduced although a circuit-opening mechanism such as a fuse is included or that its capacitor element can be made larger without also increasing the size of its casing.

A solid electrolytic capacitor embodying this invention, with which the above and other objects can be accomplished, may be characterized not only as comprising a capacitor element having a positive electrode and a negative electrode which are respectively connected electrically to a first lead and a second lead and a casing of a resin material surrounding the capacitor element but also wherein a low melting-point metal layer is inserted between and electrically connects the capacitor element and the second lead and an arc-extinguishing material capable of absorbing the melted metal of the low melting-point metallic material is provided inside a throughhole through the second lead where the latter contacts the low melting-point metal layer.

For a solid electrolytic capacitor thus characterized, the aforementioned low melting-point metal layer can be in the form of a flat ribbon such that the second lead and the contacting surface of the capacitor element can be over-lapped with respect to each other. In other words, the distance between the second lead and the capacitor element and the distance between the capacitor element and the upper surface of the casing can be both reduced. As a result, the size of the casing can be reduced accordingly or the volume of the capacitor element can be increased without increasing the size of the casing. Thus, compact solid electrolytic capacitors with high capability can be provided according to this invention.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a schematic sectional view of a solid electrolytic capacitor embodying this invention;

FIG. 2 is a schematic sectional view of the solid electrolytic capacitor of FIG. 1 after its low melting-point metal layer has been melted;

FIGS. 3A 3B, 3C, 3D, 3E, 3F and 3G (together referred to as FIG. 3) are diagonal views of the solid electrolytic capacitor of FIG. 1 at different stages of its production process; and FIG. 4 is a schematic sectional view of a prior art solid electrolytic capacitor.

DETAILED DESCRIPTION OF THE INVENTION

The invention is described next by way of an example. FIG. 1 shows a solid electrolytic capacitor embodying this invention as comprising a capacitor element 1 with its positive electrode 11 electrically connected to a first lead 2. An outer wall of the capacitor element 1 serves as its negative electrode 12 and is electrically connected to a second lead 3. The capacitor element 1 is completely covered by a casing 5 made of a resin material. What makes the solid electrolytic capacitor of FIG. 1 different from the prior art solid electrolytic capacitor of FIG. 4 is that the electrical connection between the capacitor element 1 and the second lead 3 is through a metallic layer 4 with a low melting point in a range of 300–450° C. comprising a metal such as Sn and Zn (the "low melting-point metal layer"), that the second lead 3 is provided with a throughhole 6 where it contacts the low melting-point metal layer 4, and that this throughhole 6 contains therein an arc-extinguishing material 7 which is capable of sucking in this metallic material when it is melted.

The capacitor element 1 is formed as follows. First, powder of valve action metal such as tantalum, aluminum and niobium is formed into a cube of about 1 mm and a positive electrode lead 11 is buried into it. This is sintered in a vacuum condition to obtain a sintered body with the positive electrode lead 11 buried in one of its side surfaces. Next, the root portion of the positive electrode lead 11 is covered with a Teflon ring (not shown) for protection against manganese nitrate. The tips of the positive electrode leads 11 of tens of such sintered bodies are bonded to a bar made of a stainless steel plate to carry out a chemical conversion process together to form an oxide film of $Ta_2O_2$ around the tantalum powder by anode oxidation, say, inside an aqueous solution of phosphoric acid by using these positive electrode leads 11 as anodes for electrolysis. Next, they are soaked in an aqueous solution of manganese nitrate to carry out a process for forming a layer of manganese dioxide both inside and on outer peripheral surfaces of the sintered bodies. In the meantime, a reformation process for repairing thermal damage to chemical conversion coatings is also carried out. A graphite layer or a silver layer is further formed on an outer surface to make the negative electrode 12.

The first and second leads 2 and 3 are made of planar members. During the production process, the capacitor element 1 is assembled in the form of a lead frame of an iron or copper material and later cut off and separated from the lead frame after the casing 5 is formed. Solder plating may be effected to the leads 2 and 3 such that soldering can be carried out easily when they are mounted to a printed circuit board while in the form of the lead frame or after they are cut off from the lead frame.

The second lead 3 is bent, conforming the bottom surface of the capacitor element 1 (opposite the surface from which the positive electrode lead 11 protrudes) and the outer wall on which the negative electrode 12 is formed. A throughhole 6 is formed through its portion facing the negative electrode 12. An arc-extinguishing material 7 is provided inside this throughhole 6 and, if necessarily, also on the upper surface (away from the capacitor element 1). The The throughhole 6 must be large enough so as to be able to contain therein a large enough volume of the arc-extinguishing material 7 for sucking up the metal of the low melting-point metal layer 4, and its shape is not of importance. More than one throughhole may be similarly prepared.

The arc-extinguishing material 7 is a material capable of absorbing metals with low melting points which have been melted and in a liquid form. Preferred examples of arc-extinguishing material for the present invention include quartz sand ($SiO_2$) with a high level of purity in view of its high thermal capacity and thermal conductivity. The grain size and shape of the quartz sand may be appropriately selected such that the melted metals of the low melting-point metal layer 4 can be quickly and completely absorbed. Silicone resins formed like a sponge may be used instead for the same purpose.

The low melting-point metal layer 4 is disposed between the second lead 3 and the negative electrode 12 so as not to directly contact the silver paste (shown at 8 in FIG. 1) to which the second lead 3 and the negative electrode 12 are connected. Materials such as solders which are normally used for making a solid fuse may be used for the low melting-point metal layer 4. For example, a solder wire in the shape of a ribbon may be used conveniently. Since the low melting-point metal layer 4 is intended to melt quickly by the heat generated when an abnormal condition of the capacitor element 1 occurs or the excess current when the capacitor is erroneously connected in a wrong direction, its melting point and its material are determined according to the specific purpose for which it is used. In other words, phrase "low melting-point", as used throughout herein, is intended to mean as having a melting point sufficiently low such that melting will take place by the heat generated under abnormal conditions of a specified kind that may be anticipated.

The casing 5 is for the purpose of protecting the capacitor element 1 and its connections from the outer atmosphere as well as from external forces. It may comprise an epoxy resin material and may be formed by a transfer molding method. The aforementioned silver paste 8 is for the purpose of joining the negative electrode 12 of the capacitor element 1 and the low melting-point metal layer 4. It may not be necessary if the low melting-point metal layer 4 is of a type which can be attached firmly by itself to the negative electrode 12.

Next, a production method of the solid electrolytic capacitor shown in FIG. 1 will be described with reference to FIG. 3. Firstly, the throughhole 6 is formed near one end of the second lead 3 of a planar lead frame, as shown in FIG. 3A. Secondly, the low melting-point metal layer 4 comprising a ribbon-shaped solder with thickness about 50–100 $\mu$m is pasted on that portion of the lead 3 by thermocompression bonding, as shown in FIG. 3B. Thirdly, the second lead 3 with the low melting-point metal layer 4 thus attached thereonto is bent by 90° twice in mutually opposite directions into the shape of a crank, as shown in FIG. 3C, with the low melting-point metal layer 4 on the valley side of one of the bends. Next, the silver paste 8 is applied onto the portion of the low melting-point metal layer 4 intended to contact the negative electrode 12 on the capacitor element 1, as shown in FIG. 3D. The throughhole 6 is on the opposite side of this portion where the silver paste 8 is applied. Next, the capacitor element 1 is mounted such that its negative electrode 12 contacts the silver paste 8, as shown in FIG. 3E, and is fastened by curing the silver paste 8. The capacitor element 1 is set on the second lead 3 such that the bottom surface (indicated by numeral 13) of the capacitor element 1, on which the silver paste 8 is not applied, will not contact the second lead 3. Thereafter, the lead frame, to which the capacitor element 1 is attached, is turned upside down, as shown in FIG. 3F. The throughhole 6 through the second lead 3 is filled with the arc-extinguishing material 7 such as quartz sand and it is then cured. Thereafter, the positive electrode 11 and the first lead 2 are attached, say, by welding, and the casing 5 is formed by setting a mold and using an epoxy resin material, as shown in FIG. 3G.

According to the present invention, the circuit-opening mechanism is provided by means of a metallic layer of thickness only about 50–100 $\mu$m, connected by inserting it between the negative electrode 12 of the capacitor element 1 and the second lead 3. In other words, there is no longer the need to form a low melting-point metal in an arcuate shape, and the low melting-point metal can be provided in a very small space. If temperature rises and the low melting-point metal melts, the melted metal is quickly absorbed by the arc-extinguishing material 7 which is provided in its neighborhood. Since the capacitor element 1 and the second lead 3 are both fastened inside the casing 5 by the molding of its resin material, they remain stable even after the low melting-point metal layer 4 melts and is sucked up by the arc-extinguishing material 7. After the low melting-point metal layer 4 is melted and absorbed by the arc-extinguishing material 7, the space formerly occupied by the low melting-point metal layer 4 is left as an empty gap 9, as shown in FIG. 2. As a result, the negative electrode 12 of the capacitor element 1 and the second lead 3 become electrically separated, producing an open-circuit condition. Thus, The occurrence of an accident, such as a fire breakout, as well as damage to the electronic components in the circuit in which this capacitor is incorporated, can be prevented.

In summary, a solid electrolytic capacitor according to this invention can be designed so as to occupy only a very small space although it contains a circuit-opening mechanism within itself because a low melting-point metal layer is connected in series in a very narrow space and wasteful space inside its casing can be eliminated. As a result, a larger capacitor element can be accommodated while a casing of the same size is used.

What is claimed is:

1. A solid electrolytic capacitor comprising:
   a capacitor element having a positive electrode and a negative electrode;
   a first lead electrically connected to said positive electrode;
   a second lead electrically connected to said negative electrode;
   a casing of a resin material surrounding said capacitor element;
   a low melting-point metal layer comprising a low melting-point metallic material with melting point between 300° C. and 450° C., said low melting-point metal layer electrically connecting said capacitor element and said second lead, said second lead having a throughhole where said second lead contacts said low melting-point metal layer; and
   an arc-extinguishing material filling said throughhole, said arc-extinguishing material being capable of absorbing said low melting-point metallic material when said low melting-point metal layer has melted.

2. The solid electrolytic capacitor of claim 1 wherein said low melting-point metal layer is a ribbon with thickness about 50–100 $\mu$m.

3. The solid electrolytic capacitor of claim 1 wherein said arc-extinguishing material comprises quartz sand.

4. The solid electrolytic capacitor of claim 1 wherein said arc-extinguishing material comprises silicone resin.

5. The solid electrolytic capacitor of claim 1 further comprising a silver paste disposed between and serving to connect together said negative electrode and said low melting-point metal layer, said capacitor element and said second lead contacting only through said silver paste.

6. The solid electrolytic capacitor of claim 1 wherein said capacitor element is a sintered body made of a valve action metal material.

7. The solid electrolytic capacitor of claim 6 wherein said capacitor element comprises tantalum.

8. The solid electrolytic capacitor of claim 6 wherein said capacitor element comprises aluminum.

9. The solid electrolytic capacitor of claim 6 wherein said capacitor element comprises niobium.

* * * * *